(12) United States Patent
Morin et al.

(10) Patent No.: US 11,302,812 B2
(45) Date of Patent: *Apr. 12, 2022

(54) SEMICONDUCTOR DEVICE WITH FIN AND RELATED METHODS

(71) Applicant: STMICROELECTRONICS, INC., Coppell, TX (US)

(72) Inventors: Pierre Morin, Kessel-Lo (BE); Nicolas Loubet, Guilderland, NY (US)

(73) Assignee: STMICROELECTRONICS, INC., Coppell, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/087,218

(22) Filed: Nov. 2, 2020

(65) Prior Publication Data
US 2021/0050449 A1 Feb. 18, 2021

Related U.S. Application Data (60) Division of application No. 16/680,222, filed on Nov. 11, 2019, now Pat. No. 10,854,750, which is a continuation of application No. 16/212,632, filed on Dec. 6, 2018, now Pat. No. 10,505,043, which is a continuation of application No. 15/723,152, filed on Oct. 2, 2017, now Pat. No. 10,177,255, which is a continuation of application No. 15/255,862, filed on (Continued)

(51) Int. Cl.
*H01L 29/00* (2006.01)
*H01L 29/78* (2006.01)
*H01L 29/66* (2006.01)
*H01L 29/165* (2006.01)
*H01L 27/088* (2006.01)

(52) U.S. Cl.
CPC ...... *H01L 29/7848* (2013.01); *H01L 27/0886* (2013.01); *H01L 29/165* (2013.01); *H01L 29/66795* (2013.01); *H01L 29/785* (2013.01)

(58) Field of Classification Search
None
See application file for complete search history.

(56) References Cited

U.S. PATENT DOCUMENTS 7,385,247 B2 6/2008 Rhee et al.
8,310,013 B2 11/2012 Lin
(Continued)

OTHER PUBLICATIONS

Agopian et al., "Uniaxial and/or Biaxial Strain Influence on MuGFET Devices," *Journal of the Electromechanical Society* 159(6):H570-H574, 2012.
(Continued)

*Primary Examiner* — Reema Patel
(74) *Attorney, Agent, or Firm* — Seed IP Law Group LLP (57) ABSTRACT

A semiconductor device may include a substrate, a fin above the substrate and having a channel region therein, and source and drain regions adjacent the channel region to generate shear and normal strain on the channel region. A semiconductor device may include a substrate, a fin above the substrate and having a channel region therein, source and drain regions adjacent the channel region, and a gate over the channel region. The fin may be canted with respect to the source and drain regions to generate shear and normal strain on the channel region.

20 Claims, 11 Drawing Sheets

Related U.S. Application Data

Sep. 2, 2016, now Pat. No. 9,806,196, which is a continuation of application No. 14/663,843, filed on Mar. 20, 2015, now Pat. No. 9,466,718.

(60) Provisional application No. 61/972,527, filed on Mar. 31, 2014.

(56) References Cited

U.S. PATENT DOCUMENTS

| | | |
|---|---|---|
| 8,334,185 B2 | 12/2012 | Kronholz et al. |
| 8,450,194 B2 | 5/2013 | Waite et al. |
| 8,629,477 B2 | 1/2014 | Lochtefeld et al. |
| 9,466,718 B2 | 10/2016 | Morin et al. |
| 9,806,196 B2 | 10/2017 | Morin et al. |
| 10,177,255 B2 | 1/2019 | Morin et al. |
| 10,505,043 B2 * | 12/2019 | Morin ............... H01L 29/785 |
| 2006/0154426 A1 | 7/2006 | Anderson et al. |
| 2010/0025743 A1 | 2/2010 | Hoentschel et al. |
| 2010/0133614 A1 | 6/2010 | Beyer et al. |
| 2011/0248322 A1 | 10/2011 | Wong et al. |
| 2012/0153402 A1 | 6/2012 | Kronholz et al. |
| 2012/0161238 A1 | 6/2012 | Scheiper et al. |
| 2012/0211838 A1 | 8/2012 | Kronholz et al. |
| 2012/0248595 A1 | 10/2012 | Or-Bach et al. |
| 2012/0267683 A1 | 10/2012 | Kronholz et al. |
| 2013/0001698 A1 | 1/2013 | Waite et al. |
| 2013/0095627 A1 | 4/2013 | Flachowsky et al. |
| 2013/0175585 A1 | 7/2013 | Tan et al. |
| 2013/0241026 A1 | 9/2013 | Or-Bach et al. |
| 2013/0248985 A1 | 9/2013 | Amarnath et al. |
| 2013/0267046 A1 | 10/2013 | Or-Bach et al. |
| 2013/0285116 A1 | 10/2013 | Lochtefeld et al. |
| 2013/0285138 A1 | 10/2013 | Vega et al. |
| 2013/0320449 A1 | 12/2013 | Hoentschel et al. |
| 2013/0320450 A1 | 12/2013 | Hoentschel et al. |
| 2014/0167163 A1 | 6/2014 | Cheng et al. |
| 2014/0203370 A1 | 7/2014 | Maeda et al. |
| 2015/0001593 A1 | 1/2015 | Kuo et al. |

OTHER PUBLICATIONS

Dos Santos et al., "Impact of Selective Epitaxial Growth and Uniaxial /Biaxial Strain on DIBL Effect Using Triple Gate FinFETs," *Journal Integrated Circuits and Systems* 5(2):154-159, 2010.

Xu, "Effectiveness of Strain Solutions for Next-Generation MOSFETs," Dissertation, Engineering-Electrical Engineering and Computer Sciences in the Graduate Division of the University of California, Berkeley, 2012, 103 pages.

\* cited by examiner

SEMICONDUCTOR DEVICE WITH FIN AND RELATED METHODS

TECHNICAL FIELD

The present disclosure relates to the field of electronic devices and, more particularly, to semiconductor devices and related methods.

BACKGROUND

Fin-based field effect transistors (FINFETs) are vertical transistor devices in which a semiconductor fin is located on a substrate and is used to define the source, drain, and channel regions of the device. The gate structure overlies the fin in the channel area, and in some configurations multiple fins may be used to provide a multi-gate transistor architecture. The multiple gates may be controlled by a single gate electrode, where the multiple gate surfaces act electrically as a single gate, or by independent gate electrodes.

One example FINFET device is disclosed in U.S. Pat. No. 8,310,013 to Lin et al. The FINFET device includes a substrate of a crystalline semiconductor material having a top surface of a first crystal plane orientation, a fin structure of the crystalline semiconductor material overlying the substrate, a gate structure over a portion of the fin structure, and an epitaxial layer over another portion of the fin structure. The epitaxial layer has a surface with a second crystal plane orientation. The epitaxial layer and underlying fin structure include a source and drain region. The source region is separated from the drain region by the gate structure. A channel is defined in the fin structure from the source region to the drain region, and aligned in a direction parallel to both the surface of the epitaxial layer and the top surface of the substrate. Despite the existence of such configurations, further enhancements in FINFET devices may be desirable in some applications, particularly next generation devices with relatively small dimensions.

Figure 1:
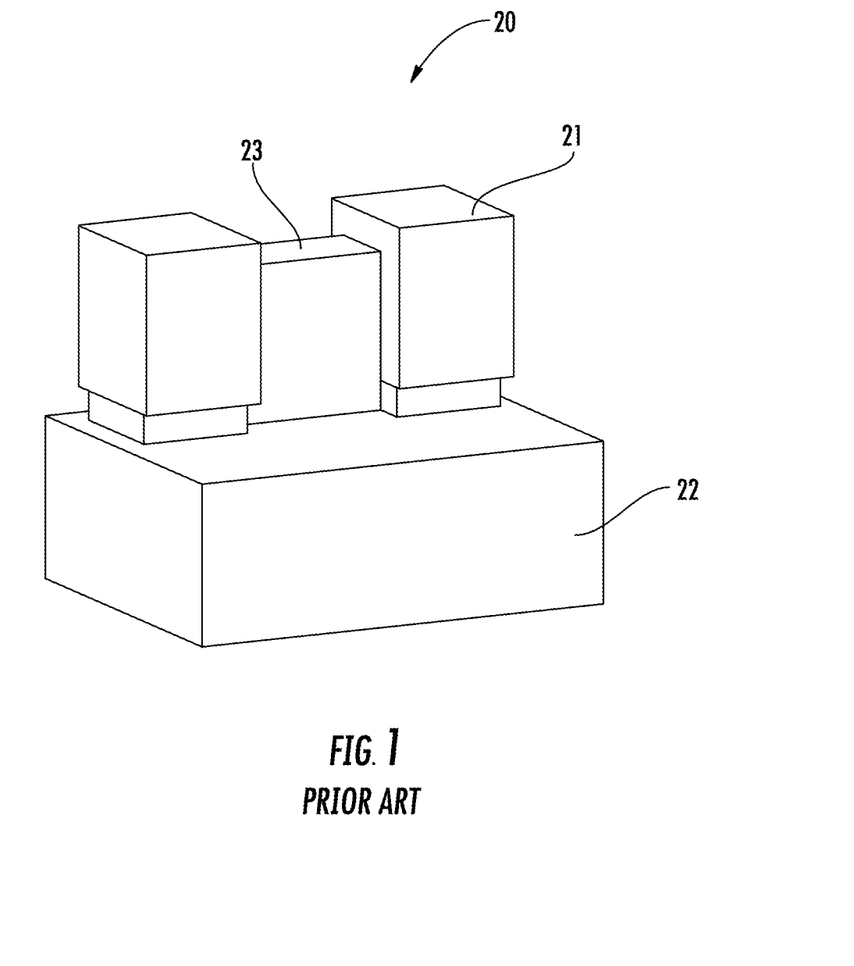
FIG. 1 is a schematic diagram of a perspective view of a semiconductor device, according to the prior art.

FIG. 1 shows an approach to a FINFET device 20. The FINFET device 20 illustratively includes a silicon substrate 22, and a silicon channel 23 over the substrate, and a silicon germanium stressor layer 21 over the channel.

SUMMARY

Generally speaking, a semiconductor device may include a substrate, at least one fin above the substrate and having a channel region therein, and source and drain regions adjacent the channel region to generate shear and normal strain on the channel region. The semiconductor device may further comprise a gate over the channel region.

In some embodiments, the source and drain regions may have a diamond shape. In other embodiments, the source and drain regions may have a Y-shape. Additionally, the semiconductor device may further comprise a dielectric layer between the substrate and the at least one fin. The substrate and the at least one fin may each comprise silicon. The source and drain regions may each comprise silicon. The dielectric layer may comprise silicon dioxide.

Another aspect is directed to a method for making a semiconductor device. The method may comprise forming at least one fin above a substrate and having a channel region therein, and forming source and drain regions adjacent the channel region to generate shear and normal strain on the channel region.

Also generally, a semiconductor device may include a substrate, at least one fin above the substrate and having a channel region therein, source and drain regions adjacent the channel region, and a gate over the channel region. The at least one fin may be canted with respect to the source and drain regions to generate shear and normal strain on the channel region.

The at least one fin may be canted at an angle in a range of 22.5-67.5 degrees with respect to the source and drain regions. In other embodiments, the at least one fin may be canted at an angle in a range of 40-50 degrees with respect to the source and drain regions.

Additionally, the semiconductor device may further comprise a dielectric layer between the substrate and the at least one fin. The substrate and the at least one fin may each comprise silicon. For example, the source and drain regions may comprise silicon germanium. The dielectric layer may comprise silicon dioxide.

Another aspect is directed to a method making a semiconductor device. The method may comprise forming at least one fin above a substrate and having a channel region therein, forming source and drain regions adjacent the channel region, and forming a gate over the channel region, the at least one fin being canted with respect to the source and drain regions to generate shear and normal strain on the channel region.

DETAILED DESCRIPTION

The present embodiments will now be described more fully hereinafter with reference to the accompanying drawings, in which preferred embodiments of the present disclosure are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and prime notation is used to indicate similar elements in alternative embodiments.

Figure 2:
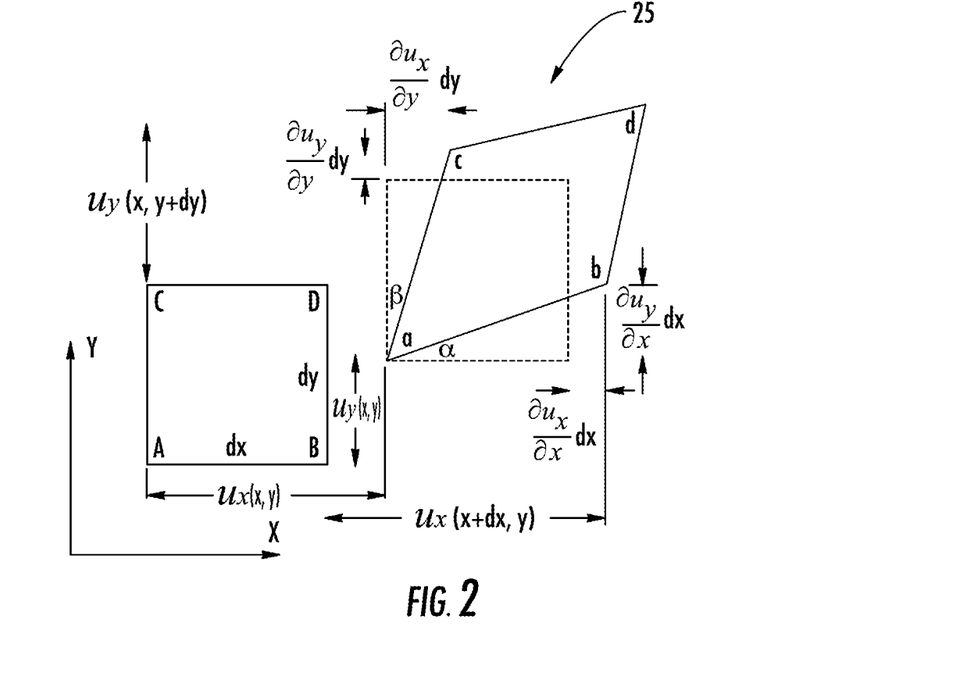
FIG. 2 is a diagram illustrating normal and shear stress, according to the present disclosure.

Referring briefly to FIG. 2, a diagram 25 illustrates normal and shear strain. Normal strain is defined by the following formula:

$$\varepsilon_x = \frac{\partial u_x}{\partial x}, \varepsilon_y = \frac{\partial u_y}{\partial x}, \varepsilon_z = \frac{\partial u_z}{\partial x}.$$

Shear strain is defined by the following formula:

$$\varepsilon_{xy} = \varepsilon_{yx} = \frac{\partial u_y}{\partial x} + \frac{\partial u_x}{\partial y},$$

$$\varepsilon_{yz} = \varepsilon_{zy} = \frac{\partial u_y}{\partial z} + \frac{\partial u_z}{\partial y},$$

$$\varepsilon_{xz} = \varepsilon_{zx} = \frac{\partial u_x}{\partial z} + \frac{\partial u_z}{\partial x}$$

$$\varepsilon_{xy} = \frac{1}{2}\left(\frac{\partial u_y}{\partial x} + \frac{\partial u_x}{\partial y}\right)$$

$$\varepsilon_{yz} = \frac{1}{2}\left(\frac{\partial u_y}{\partial z} + \frac{\partial u_z}{\partial y}\right).$$

$$\varepsilon_{xz} = \frac{1}{2}\left(\frac{\partial u_z}{\partial x} + \frac{\partial u_x}{\partial z}\right)$$

The transformation from strain tensor to stress tensor is finally obtained following the Hooke's law.

The impact on electrical performance (piezoresistance tensor) with stress is illustrated with silicon (001) surface wafer and [100] or [110] orientation. According to the crystal orientation, the effect of the shear stress on carrier mobility can be important, competitive with normal effect, depending on piezoresistance parameter (carrier type, crystal orientation and material). Table 1 provides a general valid case for any crystal orientation. (See Tables 1-3).

TABLE 1

Crystal Stress Component $$\left(\frac{\Delta\mu}{\mu}\right)_i = \begin{pmatrix} \pi_{11} & \pi_{12} & \pi_{13} & \pi_{14} & \pi_{15} & \pi_{16} \\ \pi_{12} & \pi_{22} & \pi_{23} & \pi_{24} & \pi_{25} & \pi_{26} \\ \pi_{13} & \pi_{12} & \pi_{33} & \pi_{34} & \pi_{35} & \pi_{36} \\ \pi_{14} & \pi_{24} & \pi_{34} & \pi_{44} & \pi_{45} & \pi_{46} \\ \pi_{15} & \pi_{25} & \pi_{35} & \pi_{45} & \pi_{55} & \pi_{56} \\ \pi_{16} & \pi_{26} & \pi_{36} & \pi_{46} & \pi_{56} & \pi_{66} \end{pmatrix} \begin{pmatrix} \sigma_{xx} \\ \sigma_{yy} \\ \sigma_{zz} \\ \gamma_{yz} \\ \gamma_{xz} \\ \gamma_{xy} \end{pmatrix}$$

TABLE 2

Crystal Stress Component
Crystal Orientation (001) [100]

$$\left(\frac{\Delta\mu}{\mu}\right)_i = \begin{pmatrix} \pi_{11} & \pi_{12} & \pi_{13} & 0 & 0 & 0 \\ \pi_{12} & \pi_{22} & \pi_{23} & 0 & 0 & 0 \\ \pi_{13} & \pi_{12} & \pi_{33} & 0 & 0 & 0 \\ 0 & 0 & 0 & \pi_{44} & 0 & 0 \\ 0 & 0 & 0 & 0 & \pi_{55} & 0 \\ 0 & 0 & 0 & 0 & 0 & \pi_{66} \end{pmatrix} \begin{pmatrix} \sigma_{xx} \\ \sigma_{yy} \\ \sigma_{zz} \\ \gamma_{yz} \\ \gamma_{xz} \\ \gamma_{xy} \end{pmatrix}$$

TABLE 3

Silicon Bulk Stress Values ($10^{-11}$ Pa$^{-1}$) [The pizo coefficient for the two traditional cases, including that given in Table 2.]

| $10^{-11}$ Pa | [100]N—Si | [100] P—Si | [110] N—Si | [110] P—Si |
| --- | --- | --- | --- | --- |
| $\pi_{11} = \pi_{22}$ | −102.1 | 6.6 | −31.6 | 71.8 |
| $\pi_{33}$ | −102.1 | 6.6 | −102.1 | 6.6 |
| $\pi_{12}$ | 53.4 | −1.1 | −17.6 | 66.3 |
| $\pi_{13} = \pi_{23}$ | 53.4 | −1.1 | 53.4 | −1.1 |
| $\pi_{44} = \pi_{55}$ | −13.6 | −1.1 | −13.6 | −1.1 |
| $\pi_{66}$ | −13.6 | −1.1 | −77.8 | 3.85 |
| other | 0 | 0 | 0 | 0 |

As visible on Tables 1-3, $\pi_{14}$, $\pi_{15}$ and $\pi_{16}$ of the first line of the piezo-resistance tensor impact the longitudinal conductivity in presence of shear stress. They are equal to 0 for the standard cases with the channel in [100] and [110] direction, meaning that there is no impact of the shear stress on the mobility. However, two ways are possible to take benefit from shear stress. First, for channel direction between [100] and [110] in (001) plane, i.e. theta between 0 and 45 deg, or for other less classical crystalline orientations, $\pi_{14}$, $\pi_{15}$ and $\pi_{16}$ might not be equal to zero. As a result, the shear component impacts the mobility. Second, as the magnitude of the shear stress increases, because of the strong impact of the shear stress on the band curvature responsible for mobility enhancement, some of the $\pi_{ij}$ terms can become non null, impacting the contribution of the shear stress on mobility. An indirect illustration is already demonstrated by the impact of the rotation by 45 deg from [100](001) to [110] (001). In that case, the longitudinal stress along [110] becomes a shear stress at the level of the band structure [100] oriented and impact the mobility. This is visible in Table 3 with enhanced values of $\pi_{11}$ in the [110] direction for p carrier 71.8×10$^{-11}$ Pa instead of 6.6×10$^{-11}$ Pa for the [100] direction.

Referring initially to FIGS. 3A and 4A-6A, a semiconductor device 30 according to the present disclosure is now described. The semiconductor device 30 illustratively includes a substrate 38, fins 36a-36b above the substrate and having a channel region 33 therein, and source and drain regions 31-32 adjacent the channel region to generate shear and normal strain on the channel region. In the illustrated embodiment, the semiconductor device 30 comprises a FINFET device, but the teachings herein may be applied to other semiconductor device types.

Figure 3A:
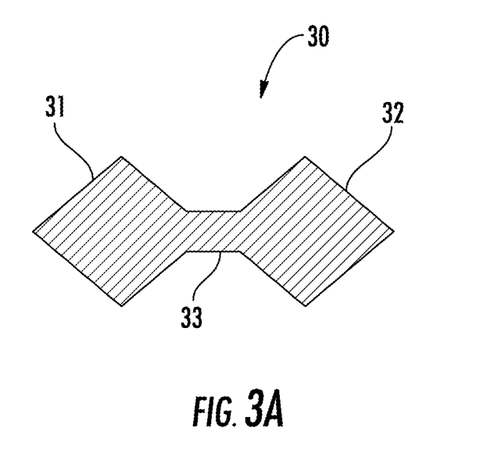
FIG. 3A is a schematic diagram of a top plan view of a semiconductor device, according to the present disclosure.

The source, drain, and channel regions 31-33 are formed from a biaxial stress layer of semiconductor material on the substrate 38. The substrate 38 may comprise a silicon bulk layer or a buried oxide substrate (i.e. a thin BOX). In other embodiments, the substrate 38 may comprise silicon on insulator (SOI) or silicon germanium on insulator (SGOI).

Advantageously, the generation of both normal and shear strain in the channel region 33 is in contrast to the prior art approach in FIG. 1, which generates only normal strain. In particular, the generation of shear strain improves carrier mobility in the channel region 33. In the present disclosure, the shear stress teachings may be effective especially for thin film channel transistors, such as fully depleted SOI (FD-SOI), ultra-thin body BOX (UTBB), and FINFETs. In FINFET embodiments, the design thereof has a greater degree of freedom in 3D structures to generate shear stress at the right place in the channel to enhance carrier mobility, thereby improving performance.

The semiconductor device 30 illustratively includes a gate 40 over the channel region. In the illustrated embodiment, the source and drain regions 31-32 have a diamond shape. Of course, in other embodiments, other shapes may be used so long as they create sufficient shear strain in the channel region 33.

Additionally, the semiconductor device 30 illustratively includes a dielectric layer 37 between the substrate 38 and the fins 36a-36b. The substrate 38 and the fins 36a-36b may each comprise silicon, for example. Also, the source and drain regions 31-32 may each comprise silicon. The dielectric layer 37 may comprise silicon dioxide, for example.

Another aspect is directed to a method for making a semiconductor device 30. The method may comprise forming at least one fin 36a-36b above a substrate 38 and having a channel region 33 therein, and forming source and drain regions 31-32 adjacent the channel region to generate shear and normal strain on the channel region.

Figure 4A:
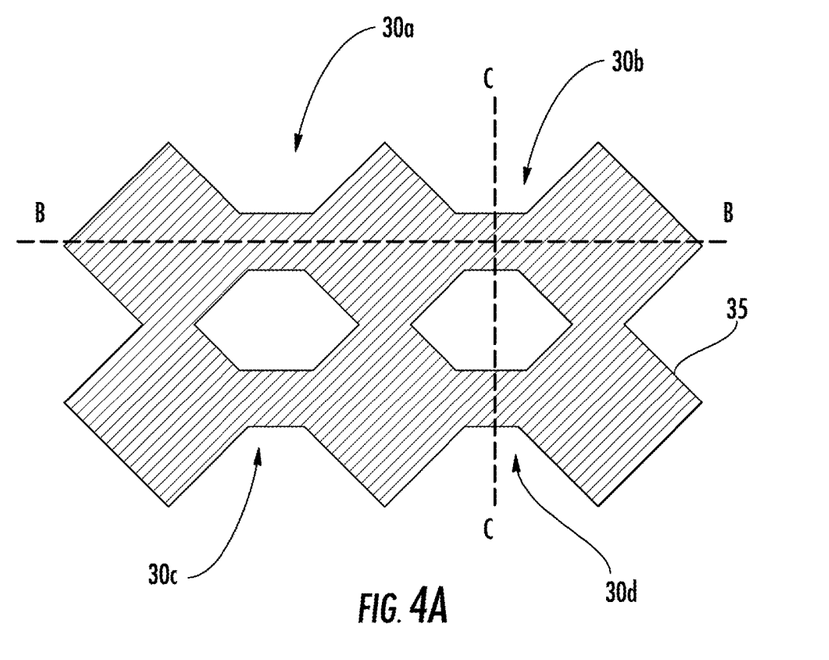
FIGS. 4A-4C are schematic diagrams of a top plan view, a cross-sectional view along line B-B, and a cross-sectional view along line C-C of a step in making a plurality of semiconductor devices of FIG. 3A, according to the present disclosure.
Figure 4B:
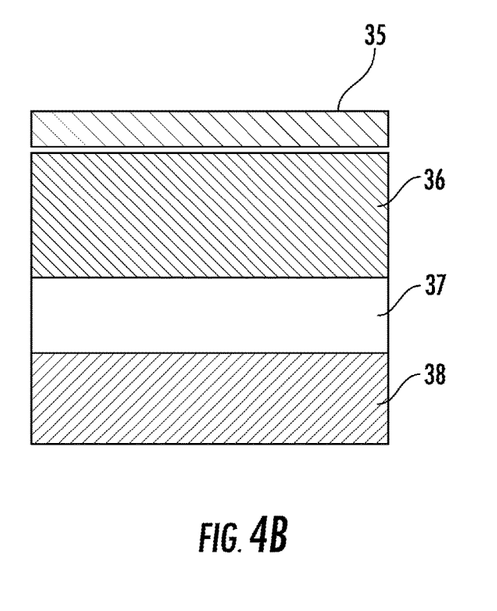
Figure 4C:
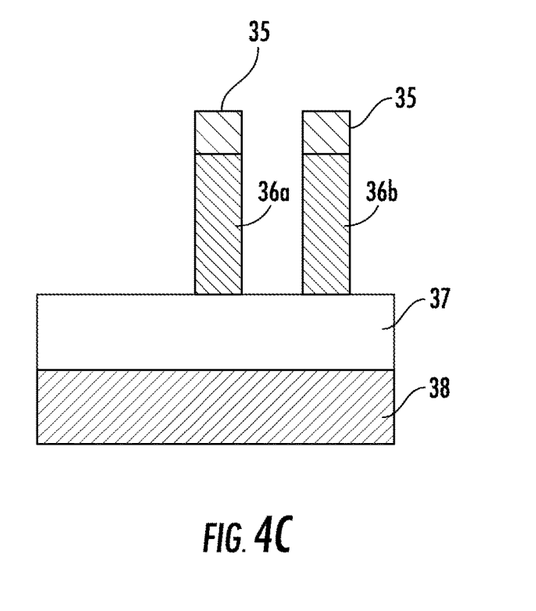
Figure 5A:
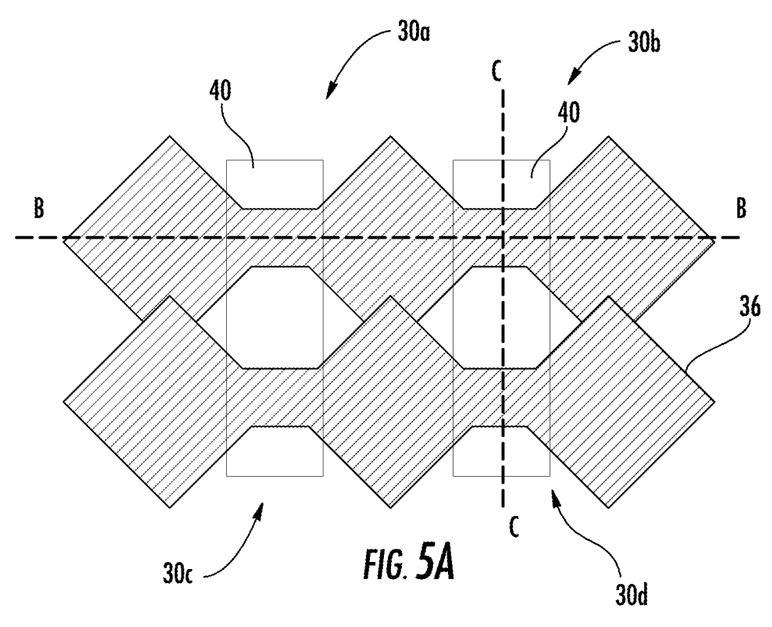
FIGS. 5A-5C are schematic diagrams of a top plan view, a cross-sectional view along line B-B, and a cross-sectional view along line C-C of a step in making a plurality of semiconductor devices of FIG. 3A, according to the present disclosure.
Figure 5B:
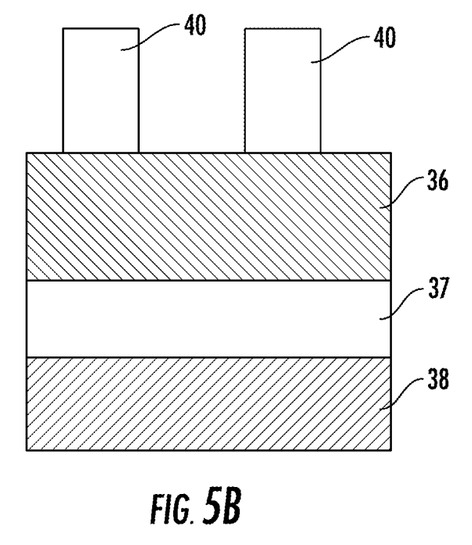
Figure 5C:
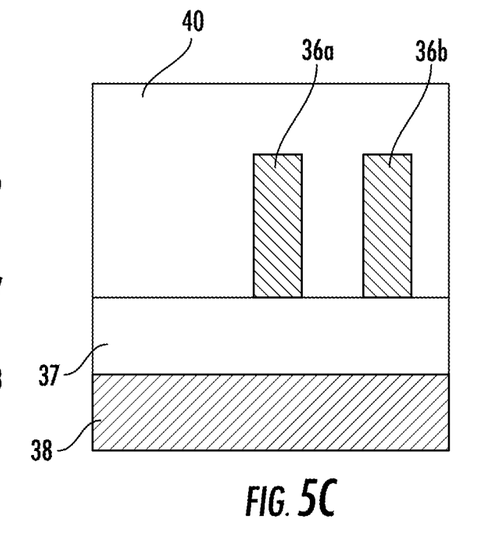

Referring now to FIGS. 4A-4C, the fins 36a-36b are formed on the dielectric layer 37, which is over the substrate 38. Subsequently, a mask layer 35 is formed over the fins 36a-36b. The mask layer 35 may comprise a silicon nitride layer, for example. Referring in particular to FIGS. 5A-5C, the gate 40 is formed on the fins 36a-36b. The gate 40 may comprise a plurality of layers comprising at least a dielectric layer, an electrically conductive layer forming a gate contact, and a resist layer.

Figure 6A:
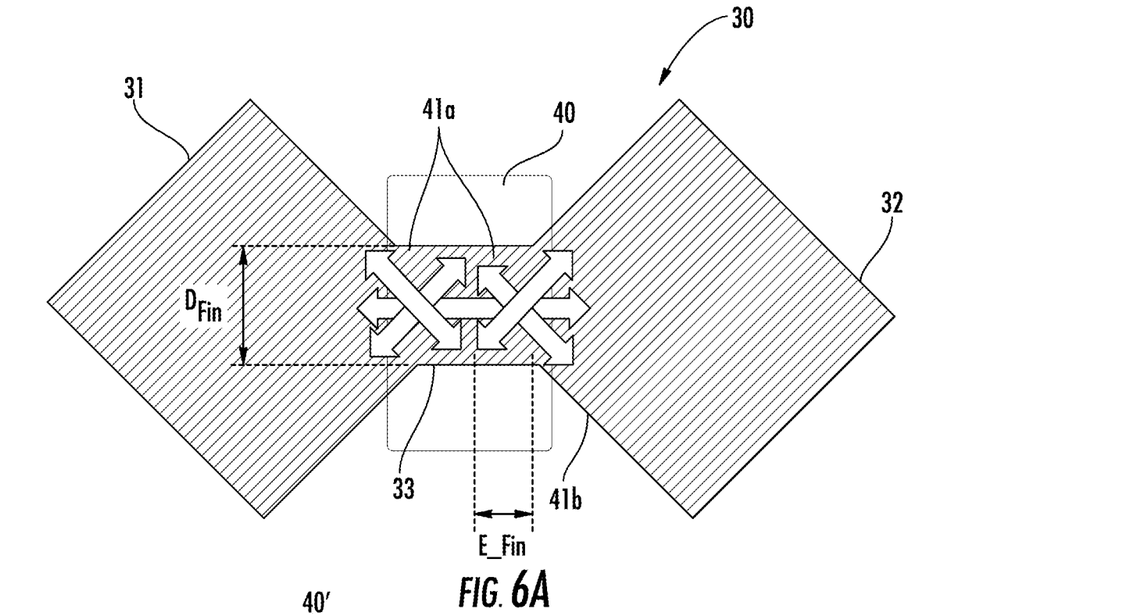
FIGS. 6A-6B are schematic diagrams of a top plan view of semiconductor devices of FIGS. 3A and 3B, respectively, with stress indicator arrows.

Referring now to FIG. 6A, an illustrative example of the semiconductor device 30 is shown with strain indicator arrows 41a-41b (shear strain 41a, normal strain 41b). The extension of the shear strain in the channel region 33 is defined by the following formula:

$$E_{Fin} = \frac{D_{Fin}}{\sqrt{2}};$$

where $E_{Fin}$=extension of the shear strain in the channel region, on both sides, which may be longer than the channel region; and $D_{fin}$ is Fin thickness. Here, the shear strain 41a is illustratively at 45 degrees, but other angles are possible.

Advantageously, the stress in the channel region 33 is obtained after shape forming for the source and drain regions 31-32. There is no need for complex epitaxial processes in the source and drain regions 31-32 to obtain the strain. Several integrations are possible, such as Fin First (formed before the dummy gate patterning) or after the gate patterning.

Figure 3B:
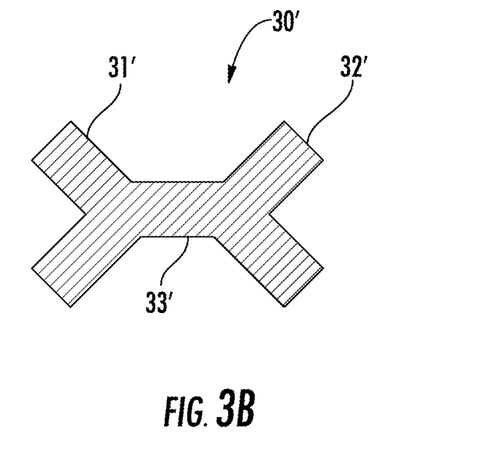
FIG. 3B is a schematic diagram of a top plan view of another embodiment of a semiconductor device, according to the present disclosure.
Figure 6B:
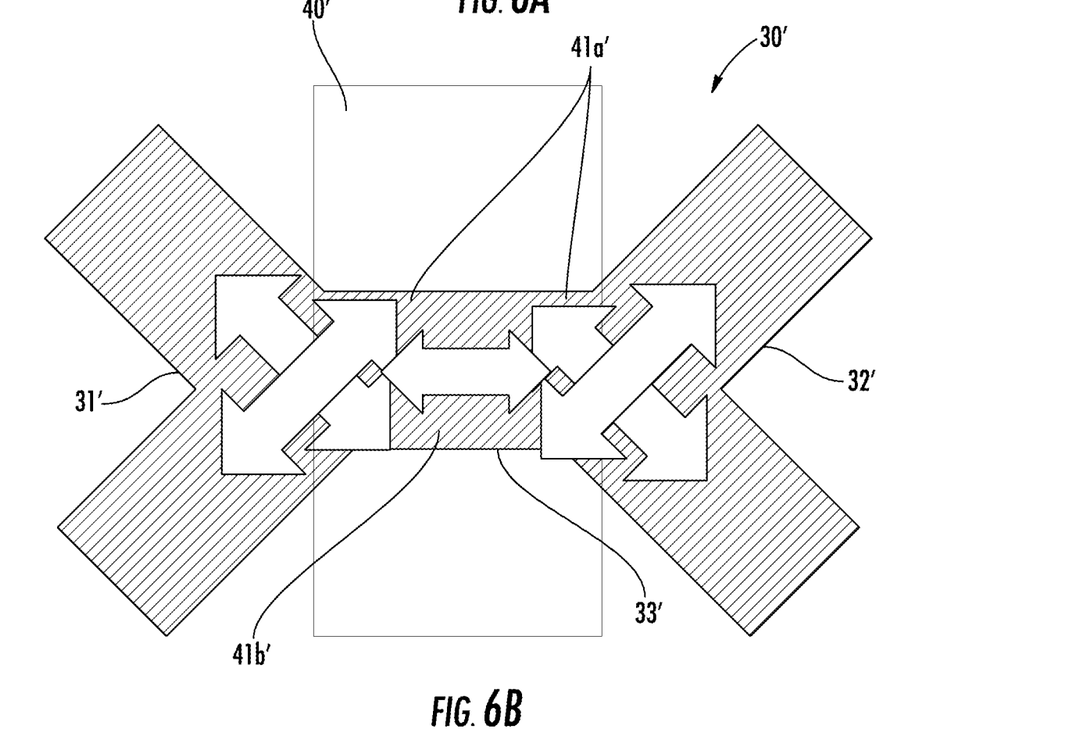

Referring now additionally to FIGS. 3B and 6B, another embodiment of the semiconductor device 30' is now described. In this embodiment of the semiconductor device 30', those elements already discussed above with respect to FIGS. 3A and 4A-6A are given prime notation and most require no further discussion herein. This embodiment differs from the previous embodiment in that this semiconductor device 30' has source and drain regions 31'-32' with a Y-shape (i.e. defining a "dog bone" shape). In particular, the source and drain regions 31'-32' each have a pair of arms extending in opposite directions, which create shear strain on the channel region 33'.

Figure 7A:
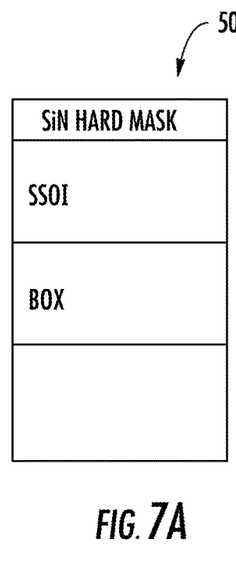
FIGS. 7A-7D are schematic diagrams of layer stacks for embodiments of a semiconductor device, according to the present disclosure.
Figure 7B:
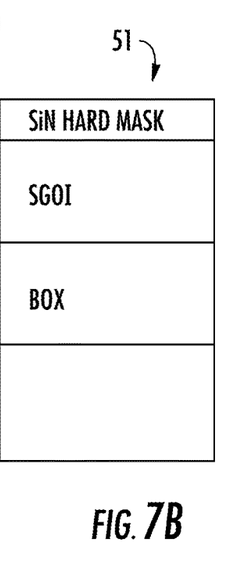
Figure 7C:
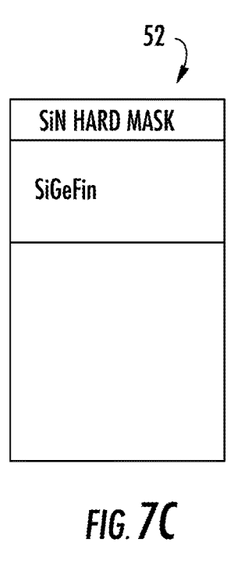
Figure 7D:
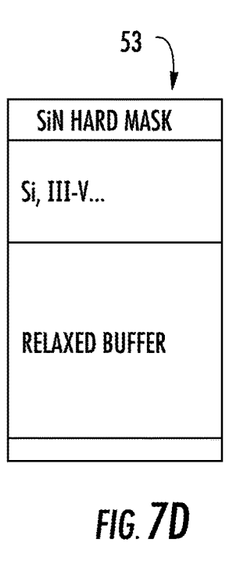

Referring now to FIGS. 7A-7C, several examples of heavy metal deposition layer stacks are shown. The diagrams 50-53 illustrate several embodiments for forming the semiconductor device 30. These diagrams 50-53 illustrate the possibility of using different stressed channel materials (to replace region 30) with strained SOI, strained SGOI as well with SiGe layer, III-V or any material epitaxially grown on silicon substrate to form the channel.

Referring now to FIGS. 8A-12C, another semiconductor device 70a-70d according to the present disclosure is now described. The semiconductor device 70a-70d illustratively includes a substrate 81, a plurality of fins 83a-83c above the substrate and having a channel region 73 therein, source and drain regions 71-72 adjacent the channel region, and a gate 84a-84d over the channel region. Each of the plurality of fins 83a-83c may be canted with respect to the source and drain regions 71-72 to generate shear and normal strain on the channel region 73. In FIG. 8B, the semiconductor device 30 is shown with shear strain indicator arrows 86. In the illustrated embodiment, the semiconductor device 70a-70d comprises a FINFET device, but the teachings herein may be applied to other semiconductor device types.

Figure 8A:
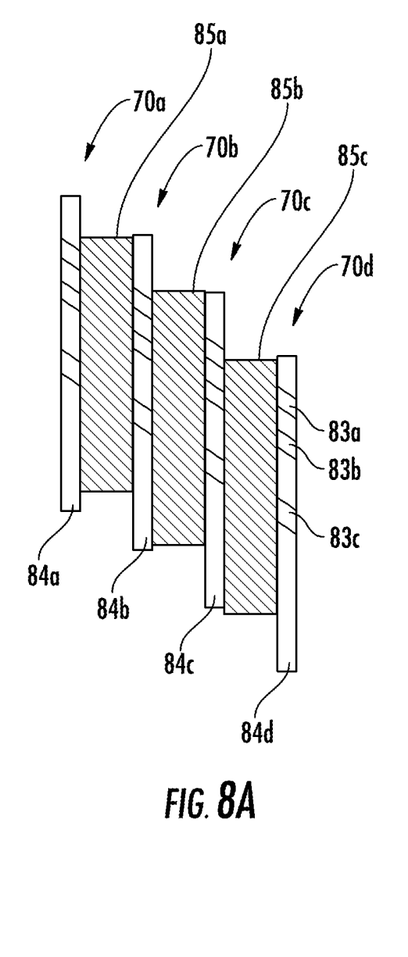
FIGS. 8A and 8B are schematic diagrams of a top plan view and an enlarged top plan view of another embodiment of a semiconductor device, according to the present disclosure.
Figure 8B:
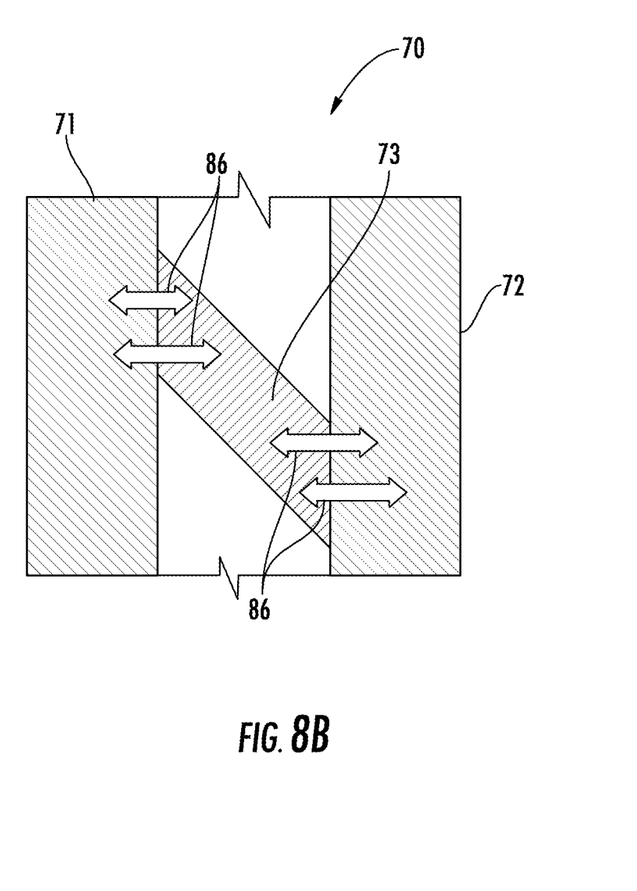

In the illustrated embodiment, each of the fins 83a-83c is canted at an angle of 45 degrees with respect to the source and drain regions 71-72. In other embodiments, each of the fins 83a-83c may be canted at an angle less than 45 degrees with respect to the source and drain regions 71-72, or in the range of 22.5-67.5 degrees or for improved performance, in the range of 40-50 degrees.

Additionally, the semiconductor device 70a-70d illustratively includes a dielectric layer 82 between the substrate 81 and the plurality of fins 83a-83c. The substrate 81 and the plurality of fins 83a-83c may each comprise silicon, for example. For example, the source and drain regions 71-72 may comprise silicon germanium. Also, the dielectric layer 82 may comprise silicon dioxide.

Another aspect is directed to a method making a semiconductor device 70a-70d. The method may comprise forming at least one fin 83a-83c above a substrate 81 and having a channel region 73 therein, forming source and drain regions 71-72 adjacent the channel region, and forming a gate 84a-84d over the channel region, the at least one fin being canted with respect to the source and drain regions to generate shear and normal strain on the channel region.

Figure 9A:
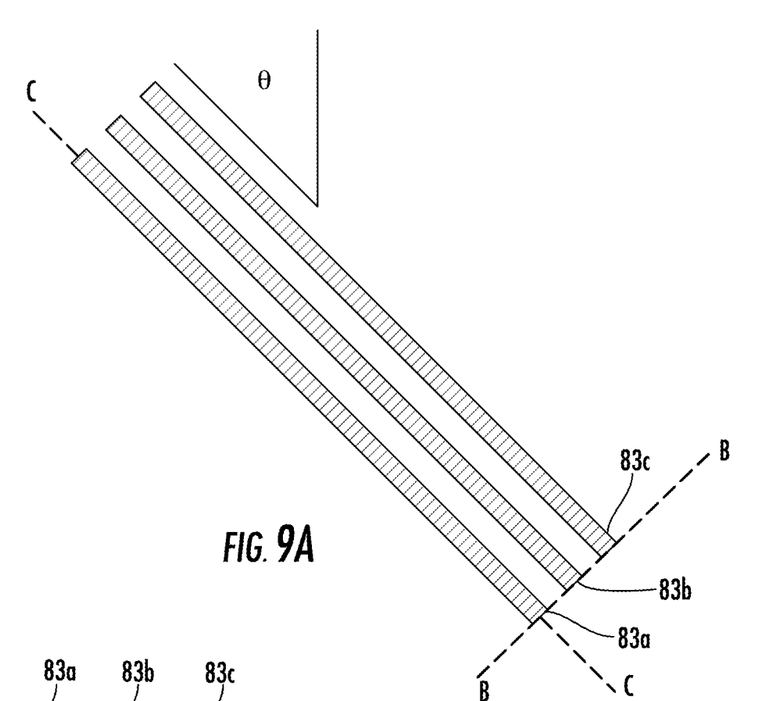
FIGS. 9A-9C are schematic diagrams of a top plan view, a cross-sectional view along line B-B, and a cross-sectional view along line C-C of a step in making a plurality of semiconductor devices of FIGS. 8A-8B, according to the present disclosure.
Figure 9B:
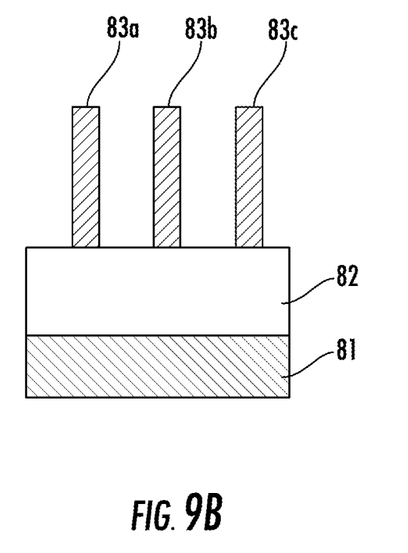
Figure 9C:
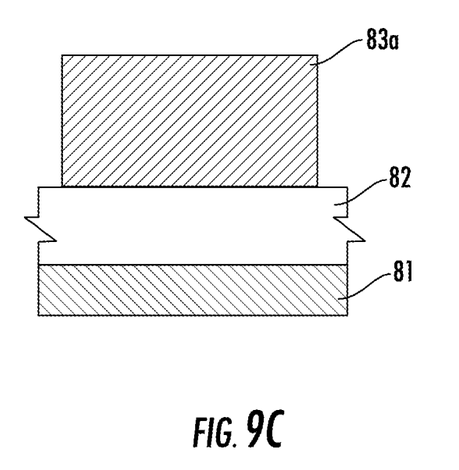
Figure 10A:
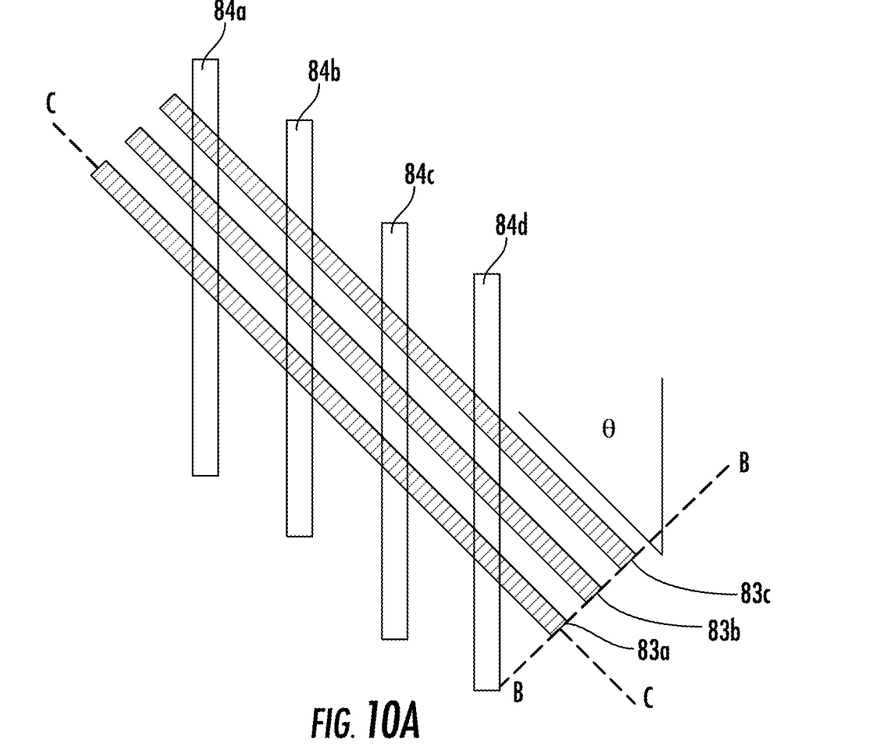
FIGS. 10A-10C are schematic diagrams of a top plan view, a cross-sectional view along line B-B, and a cross-sectional view along line C-C of a step in making a plurality of semiconductor devices of FIGS. 8A-8B, according to the present disclosure.
Figure 10B:
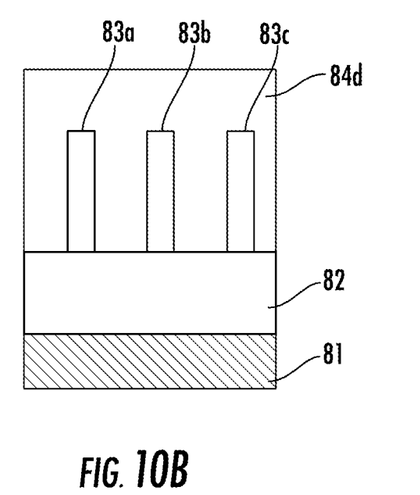
Figure 10C:
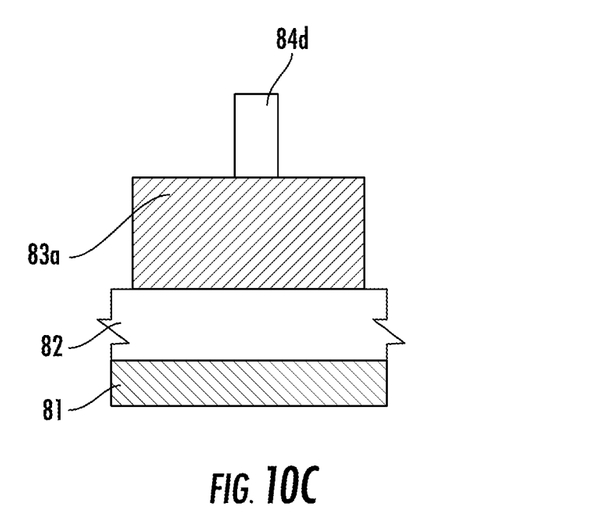
Figure 11A:
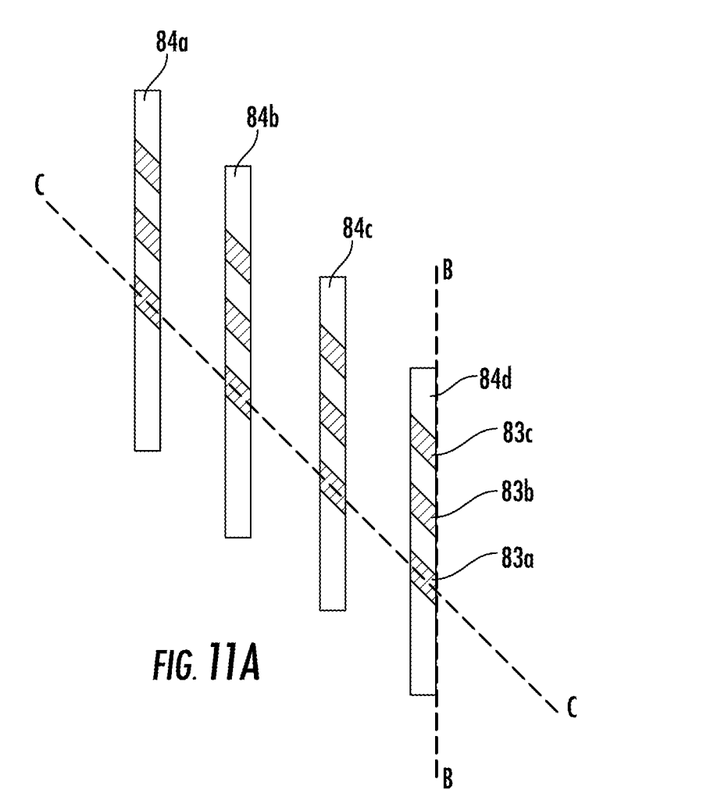
FIGS. 11A-11C are schematic diagrams of a top plan view, a cross-sectional view along line B-B, and a cross-sectional view along line C-C of a step in making a plurality of semiconductor devices of FIGS. 8A-8B, according to the present disclosure.
Figure 11B:
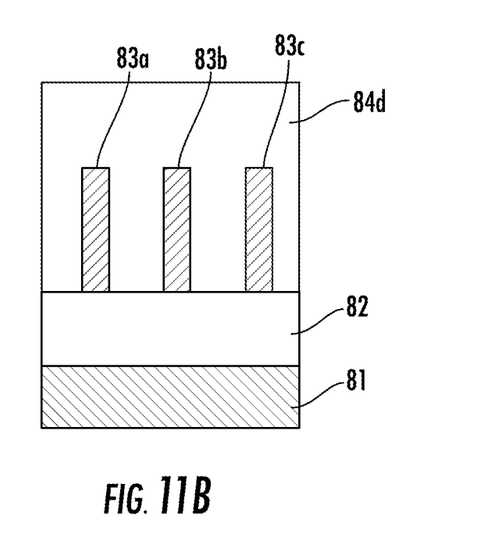
Figure 11C:
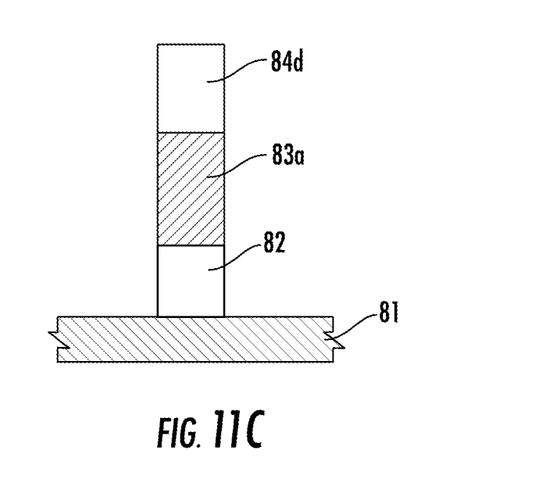
Figure 12A:
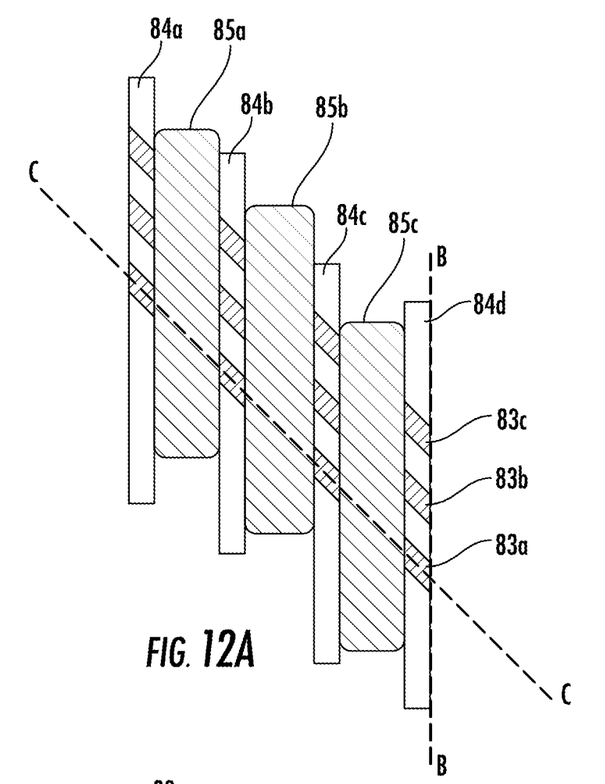
FIGS. 12A-12C are schematic diagrams of a top plan view, a cross-sectional view along line B-B, and a cross-sectional view along line C-C of a step in making a plurality of semiconductor devices of FIGS. 8A-8B, according to the present disclosure.
Figure 12B:
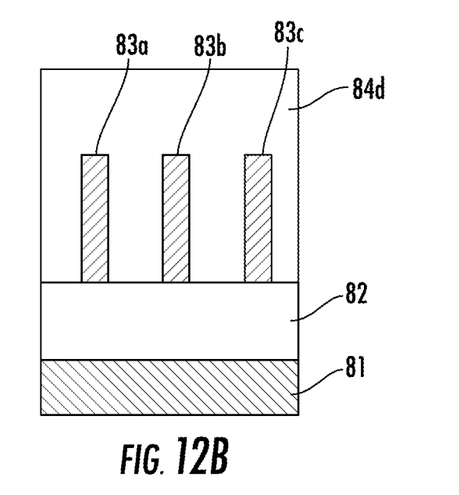
Figure 12C:
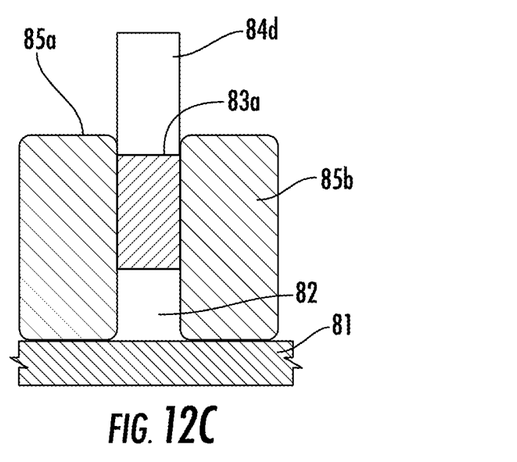

Referring in particular to FIGS. 9A-9C, the method illustratively includes forming the plurality of fins 83a-83c on the dielectric layer 82, which is above the substrate 81. In FIGS. 10A-10C, the gate 84a-84d is formed on the fins 83*a*-83*c* and the dielectric layer 82. In FIGS. 11A-11C, the recesses for the source and drain regions 71-72 are formed during an etching step. In FIGS. 12A-12C, the source and drain regions 71-72 are formed from an epitaxial layer 85*a*-85*c*. The epitaxial layer 85*a*-85*c* may comprise silicon germanium, for example.

Advantageously, the method for making the semiconductor device 70*a*-70*d* is a self-aligned process, i.e. no additional mask layers are necessary. Moreover, the semiconductor device 70*a*-70*d* may also work if the fins 83*a*-83*c* are already intrinsically strained (e.g. SGOI, silicon germanium fin, SSOI etc.). In that case, the shear is added to the standard longitudinal stress in the fin coming from the intrinsic strain and brings more efficiency. Also, this method of making a semiconductor device 70*a*-70*d* could help to increase the surface for source-drain stressor for a given gate pitch.

A fin field-effect transistor (FINFET) semiconductor device comprising: a substrate; a plurality of fins above said substrate, each fin having a channel region therein; and a plurality a source and drain regions respectively adjacent the channel regions to generate shear and normal strain on the channel regions. The FINFET semiconductor device further comprising a plurality of gates respectively over the channel regions. The plurality of source and drain regions have a diamond shape. The plurality of source and drain regions have a Y-shape.

A method for making a semiconductor device comprising: forming at least one fin above a substrate and having a channel region therein; forming source and drain regions adjacent the channel region to generate shear and normal strain on the channel region; and forming a gate over the channel region. The method includes forming source and drain regions have a diamond shape. The method includes forming source and drain regions have a Y-shape. The method includes forming a dielectric layer between the substrate and the at least one fin. The dielectric layer comprises silicon dioxide. The substrate and the at least one fin each comprises silicon.

The source and drain regions each comprises silicon. A fin field-effect transistor (FINFET) semiconductor device comprising: a substrate; a plurality of fins above said substrate, each fin having a channel region therein; a plurality of source and drain regions respectively adjacent the channel regions; and a plurality of gates respectively over the channel regions; said plurality of fins being canted with respect to said plurality of source and drain regions to generate shear and normal strain on the channel regions. The plurality of fins is canted at an angle in a range of 22.5-67.5 degrees with respect to said plurality of source and drain regions. The plurality of fins is canted at an angle in a range of 40-50 degrees with respect to said plurality of source and drain regions. The FINFET semiconductor device includes a dielectric layer between said substrate and said plurality of fins. The dielectric layer comprises silicon dioxide. The substrate and said plurality of fins each comprises silicon. The plurality of source and drain regions comprise silicon germanium.

The method may further include forming a dielectric layer between the substrate and the at least one fin, the substrate and the at least one fin each comprises silicon, and the source and drain regions comprise silicon germanium.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

The invention claimed is:

1. A method, comprising:
forming a semiconductor fin over a dielectric layer that is over a top surface of a substrate, the semiconductor fin extending in a first direction;
forming a plurality of gate structures over the semiconductor fin, the plurality of gate structures extending in a second direction that is canted with respect to the first direction;
forming recesses on opposite sides of the plurality of gate structures, the recesses exposing the top surface of the substrate; and
epitaxially growing a semiconductor material in the recesses.

2. The method of claim 1 wherein the epitaxially growing the semiconductor material in the recesses comprises epitaxially growing the semiconductor material from top surface of the substrate and sidewall surfaces of remaining portions of the semiconductor fin.

3. The method of claim 1 wherein the forming the recesses comprises removing portions of the semiconductor fin and the dielectric layer on the opposite sides of the plurality of gate structures.

4. The method of claim 3 wherein the removing portions of the semiconductor fin and the dielectric layer on the opposite sides of the plurality of gate structures comprises etching the portions of the semiconductor fin and the dielectric layer on the opposite sides of the plurality of gate structures.

5. The method of claim 1 wherein the epitaxially growing the semiconductor material in the recesses comprises epitaxially growing silicon germanium in the recesses.

6. The method of claim 1 wherein the recesses expose sidewalls of remaining portions of the semiconductor fin and remaining portions of the dielectric layer.

7. A method, comprising:
forming a fin-shaped semiconductor structure over a substrate, the fin-shaped semiconductor structure oriented along a first direction;
forming a gate structure that interfaces the fin-shaped semiconductor structure at two or more surfaces of the fin-shaped semiconductor structure; and
forming a source or drain structure on a side of the gate structure, the source or drain structure interfacing with an edge surface of the fin-shaped semiconductor structure, the edge surface being at an oblique angle to the first direction.

8. The method of claim 7 wherein the forming the source or drain structure includes:
forming a recess in the fin-shaped semiconductor structure, the recess having a sidewall surface at the oblique angle to the first direction; and
epitaxially growing a semiconductor layer in the recess.

9. The method of claim 8 wherein the semiconductor layer is silicon germanium.

10. The method of claim 9 wherein the fin-shaped semiconductor structure is silicon.

11. The method of claim 7 wherein the oblique angle is in a range from 22.5 degrees to 67.5 degrees.

12. The method of claim 7 wherein the oblique angle is in a range from 40 degrees to 50 degrees.

13. The method of claim 8 wherein the forming the recess forms the recess through the fin-shaped semiconductor structure and exposes the substrate through the recess.

14. The method of claim 7, comprising forming a dielectric layer over the substrate,
wherein the fin-shaped semiconductor structure is formed over the dielectric layer.

15. A method, comprising:
forming a plurality of semiconductor fin structures over a substrate, the plurality of semiconductor fin structures each oriented in a first direction;
forming a plurality of gate structures each overlapping the plurality of semiconductor fin structures, the plurality of gate structures each oriented along a second direction that is at an oblique angle to the first direction;
forming recesses in the plurality of semiconductor fin structures between the plurality of gate structures; and
forming source or drain structures in the recesses, the source or drain structures extending in the second direction.

16. The method of claim 15 wherein the oblique angle is in a range from 22.5 degrees to 67.5 degrees.

17. The method of claim 15 wherein the substrate is silicon.

18. The method of claim 15 wherein the forming the source or drain structures includes growing an epitaxial semiconductor layer in the recesses.

19. The method of claim 15 wherein the source or drain structures each contacts a respective one of the plurality of semiconductor fin structures at a surface along the second direction.

20. The method of claim 15 wherein the recesses are formed to reach the substrate.

* * * * *